United States Patent [19]

Fotowat-Ahmady et al.

[11] Patent Number: 5,296,761
[45] Date of Patent: Mar. 22, 1994

[54] TEMPERATURE-COMPENSATED LOGARITHMIC DETECTOR HAVING A WIDE DYNAMIC RANGE

[75] Inventors: Ali Fotowat-Ahmady, Tehran, Iran; Nasrollah S. Navid, Saratoga, Calif.

[73] Assignee: North American Philips Corporation, New York, N.Y.

[21] Appl. No.: 974,631

[22] Filed: Nov. 23, 1992

[51] Int. Cl.⁵ .............................................. H03F 1/30
[52] U.S. Cl. ................................... 307/492; 307/310; 307/491; 307/494; 307/418
[58] Field of Search ............... 307/492, 491, 310, 494, 307/498; 328/26, 32

[56] References Cited

U.S. PATENT DOCUMENTS

| | | | |
|---|---|---|---|
| 3,417,263 | 12/1968 | Thomas | 307/492 |
| 3,745,474 | 7/1973 | Hughes | 307/492 |
| 3,848,139 | 11/1974 | Holt, Jr. | 307/235 |
| 4,053,796 | 10/1977 | van de Plassche | 307/261 |
| 4,593,268 | 6/1986 | Blauschild | 340/347 AD |
| 4,972,512 | 11/1990 | Garskamp | 307/492 |
| 5,049,829 | 9/1991 | Garskamp et al. | 307/492 |
| 5,070,303 | 12/1991 | Dent | 307/492 |
| 5,130,567 | 7/1992 | Rutten et al. | 307/491 |

OTHER PUBLICATIONS

"Analysis and Design of Analog Integrated Circuits", Sec. Edition. P. Gray and R. Meyer, Wiley & Sons, 1984, pp. 197, 203, 275–284, 284–296.

Primary Examiner—William L. Sikes
Assistant Examiner—My-Trang Nu Ton
Attorney, Agent, or Firm—Steven R. Biren

[57] ABSTRACT

An IF amplifier/log detector with a modular architecture includes a plurality of voltage amplifiers, a plurality of rectifiers, a plurality of voltage-to-current converters and a current summing circuit. Each amplifier has a first differential transistor pair driven by a first current proportional to the temperature to fix the gain. Each converter includes a second differential transistor pair driven by a current proportional to the temperature and inversely proportional to a process parameter, and a third differential transistor pair driven by a third current inversely proportional to the process parameter. In this manner a circuit having improved performance with variations in temperature and process parameters is obtained.

6 Claims, 3 Drawing Sheets

TEMPERATURE-COMPENSATED LOGARITHMIC DETECTOR HAVING A WIDE DYNAMIC RANGE

BACKGROUND OF THE INVENTION

The invention relates to an electronic circuit with a logarithmic detector and to an apparatus having such detector, such as a digital cellular telephone.

A logarithmic detector provides an output signal that represents the logarithm of an input signal. Such a circuit is used in equipment that processes an input signal having a wide dynamic range, such as cellular radios, digital cellular telephones, spectrum analyzers, cordless telephones and radar equipment. The logarithmic detector typically functions as a received signal strength indicator (RSSI). In cellular radio, this function is necessary for continuously monitoring the received signal strength by the radio's microcontroller. The RSSI function requires a dc output voltage which is proportional to the logarithm of the input signal level.

Typically, such a detector is composed of a cascade of signal amplifiers. For the sake of clarity, it is assumed that the amplifiers have identical linear-amplification ranges and identical amplification "A". The first amplifier of the cascade receives an input signal "v" that is successively amplified by the subsequent amplifiers in the cascade. The repetitive amplification continues until a particular amplifier runs out of its linear range and into its limiting range. In its limiting range, each amplifier furnishes a clipped version of its amplified input signal. The n-th amplifier along the cascade runs into its limiting range when its output signal $A^n v$ exceeds the limit of the linear amplification range. Consequently, the input signal values at which the respective amplifiers leave their linear amplification ranges are proportional to $A^{-n}$. Summing the output signals of all amplifiers approximates a linear function of the logarithm of the input signal.

In practice, the amplifiers are signal voltage amplifiers. The signals-supplied by the cascade have to be rectified in order to generate a dc output quantity representative of the signal's strength. Generally, an interstage filter is inserted into the cascade for reducing noise and preventing regeneration. Such a filter, however, causes undesired losses in amplitude. The output voltages therefore usually are rescaled for loss-compensation before being processed further.

In prior art integrated circuit NE605, manufactured by Signetics Co. (Philips Semiconductors), the output voltages of the amplifiers are routed to a rectifying element via a resistor ladder formed of stacked pairs of resistors. The amplifiers have complementary outputs connected to nodes between particular pairs of resistors. The voltage division attained in this way takes care of the rescaling of the signal. The rescaling, however, also affects the various dc levels of the voltages at the ladder nodes. These rescaled dc levels are to be removed from the rectifier output signal in a subsequent circuit.

The supply voltage required for operating the prior art circuit therefore is determined, among other things, by the resistor ladder. Further, removing the dc levels from the rectified signal requires additional circuitry. As a result, the detector has to be redesigned for each particular combination of rescaling resistors. Also, since various resistor values are used in a ladder, the accuracy of the resistor values should be high in order to reduce the accumulation of signal distortion in the ladder and beyond, due to temperature influences and process parameter spread dependencies.

SUMMARY OF THE INVENTION

It is a first object of the invention to provide a logarithmic detector that is more easily manufactured than the prior art detectors. It is a second object to create a logarithmic detector and IF amplifier arrangement in which the IF gain and the log detector characteristics are compensated for temperature and process parameter spread dependencies at the same time. It is a third object to provide a detector with a wide dynamic range. It is a fourth object to supply an integrated circuit with a fully integrated detector.

To this end, the invention provides an electronic circuit with an IF amplifier/logarithmic detector having amplifying means responsive to an input voltage for amplifying the input voltage to produce a series of amplified versions of the input voltage; rectifying means connected to the amplifying means for rectifying the amplified versions to produce rectified versions; conversion means coupled to the rectifying means for converting the rectified versions into currents; and current summing means coupled to the conversion means for summing the currents to produce an aggregated current at an output.

In contrast with the prior art, the rectifying means in the present invention are connected to the amplifying means for reception of the amplified voltages and subsequent rectification. Voltage-to-current conversion and any other operations are performed after rectification, as this considerably simplifies the manufacturing process. The subcircuits of the detector that generate the various versions of the input voltage are made identical, as are the stages that rectify the various versions. The conversion portions can be made substantially identical. Thus, a modular architecture is obtained that can be expanded simply by adding modules, each with an amplifier, rectifier, and a conversion unit. In addition, influences of temperature variations and process parameter spread are substantially reduced, as the modular structure gives rise to predictable and uniform effects.

In an embodiment of the circuit of the invention, the functional parts are implemented as follows. The amplifying means comprises a cascade of a plurality of voltage amplifiers, each for generating a respective one of the amplified versions of the input voltage. Each voltage amplifier comprises a first differential transistor pair having first and second transistors being connected to a first current source and being operative to complementarily control first and second current branches, respectively. The first and second branches comprises first and second resistors, respectively. The conversion means comprises a plurality of converters, each respective one thereof being coupled to a respective one of the voltage amplifiers. Each converter comprises a second differential transistor pair biased by a second current source and having a third current branch with a first load that includes a first load transistor, and having a fourth current branch with a second load that includes a second load transistor. The first and second loads may each include, for example, a diode. Main current paths of the first pair are interconnected via a resistor. Each converter further has a third differential transistor pair biased by a third current source. The third pair has first and second control electrodes coupled to the third and fourth current branches, respectively, between the first and second loads, respectively, and the first pair. The first current source supplies a first current whose value is substantially proportional to the absolute temperature to fix the gain of the amplifier. The second current source and the third current source supply second and third currents, respectively. A ratio of values of the third and second currents is substantially proportional to the absolute temperature.

The first current fixes the gain of each voltage amplifier independent of temperature. This fixed gain is required for a fixed start-up point, i.e., the signal level at which detection begins. However, without any additional measures, the voltage produced by the aggregated current across an RSSI resistor would be directly proportional to the absolute temperature due to the specific temperature dependence of the first current. Therefore, the second and third currents are produced with the dependencies as stated above. In the eventual voltage generated across an RSSI resistor by the aggregated current, the ratio of the third current and the second current cancels both the temperature and process parameter influences. This embodiment of the invention provides a particularly advantageous implementation of the RSSI function for a digital cellular phone or digital cordless phone, where the stability of the RSSI function in the whole signal range is a critical aspect.

Current sources supplying currents that are substantially proportional to the absolute temperature and substantially inversely proportional to a resistivity value of a particular resistor generally are known; see for example, "Analysis and Design of Analog Integrated Circuits", Sec. Edition, P. Gray and R. Meyer, Wiley & Sons, 1984, pp. 275-284. Current sources that supply currents substantially inversely proportional to a resistivity value of a particular resistor but not directly proportional to temperature also are known, for example, from "Analysis and Design of Analog Integrated Circuits", Sec. Edition, P. Gray and R. Meyer, Wiley & Sons, 1984, pp. 284-296.

BRIEF DESCRIPTION OF THE DRAWING

Various aspects of the invention are discussed below by way of example and with reference to the accompanying drawing, wherein.

Throughout the Figures, the same reference numerals generally indicate identical or corresponding features.

DESCRIPTION OF THE PREFERRED EMBODIMENTS

Figure 1:
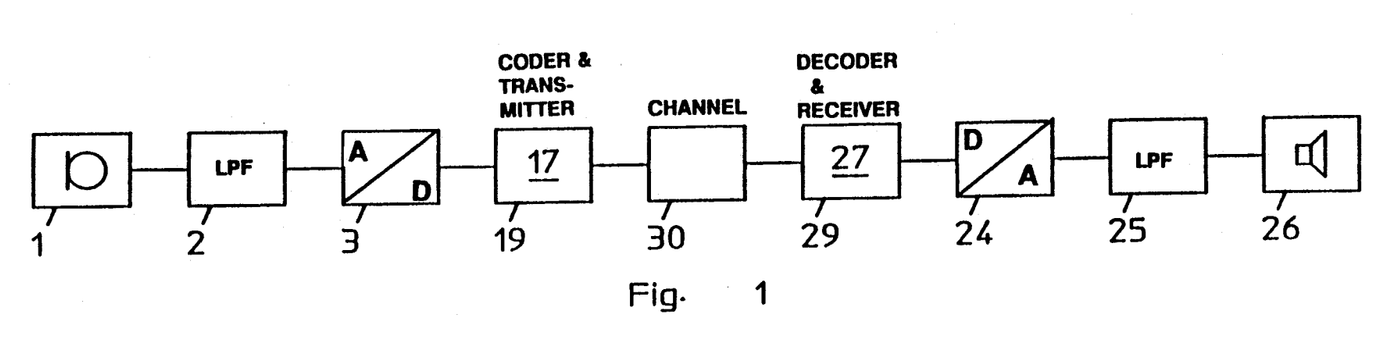
FIG. 1 is a block diagram of an electronic circuit according to the invention.

FIG. 1 is a block diagram of a circuit having an IF amplifier/log detector in accordance with the invention and suitable for use in, for example, a digital cellular phone. The circuit includes a cascade of amplifiers 12, 14 and 16 that successively amplify an input signal voltage at an input 18. Each of the amplifiers 12-16 provides an output signal to a corresponding rectifier 20, 22 and 24. Each rectifier 20-24 supplies, at a rectifier output, a signal voltage representative of a rectified version of the output voltage of the associated amplifier 12-16. The rectifiers 20-24 have their outputs respectively coupled to voltage-to-current converters 26, 28 and 30 that transform the rectified voltages into output currents. NPN transfer transistors 32, 34 and 36 each couple a respective output of converters 26-30 to an input 38 of a current mirror 40. Control electrodes of transfer transistors 32-36 receive a control voltage Vref. An RSSI-resistor 42 is arranged between an output 44 of current mirror 40 and ground.

If the amplitude of the input signal is small, amplifiers 12-16 remain in their linear amplification range. The output signal of each amplifier then follows the input signal at input 18. If the amplitude of the input signal increases, amplifier 16 will be the first to be driven out of its linear region since it receives the largest signal. Amplifier 16 then provides a clipped version of the amplified input signal at its output. If the signal's amplitude of the input signal keeps rising, amplifier 14 will then be driven out of its linear range before amplifier 12.

As explained above, this mode of operation serves as the basis for an IF amplifier/logarithmic detector. Note that the modular architecture considerably simplifies the design of such a circuit. Also note that the modular structure permits increasing the number of cascaded stages without substantially changing the modules, and simplifies testing.

Figure 2:
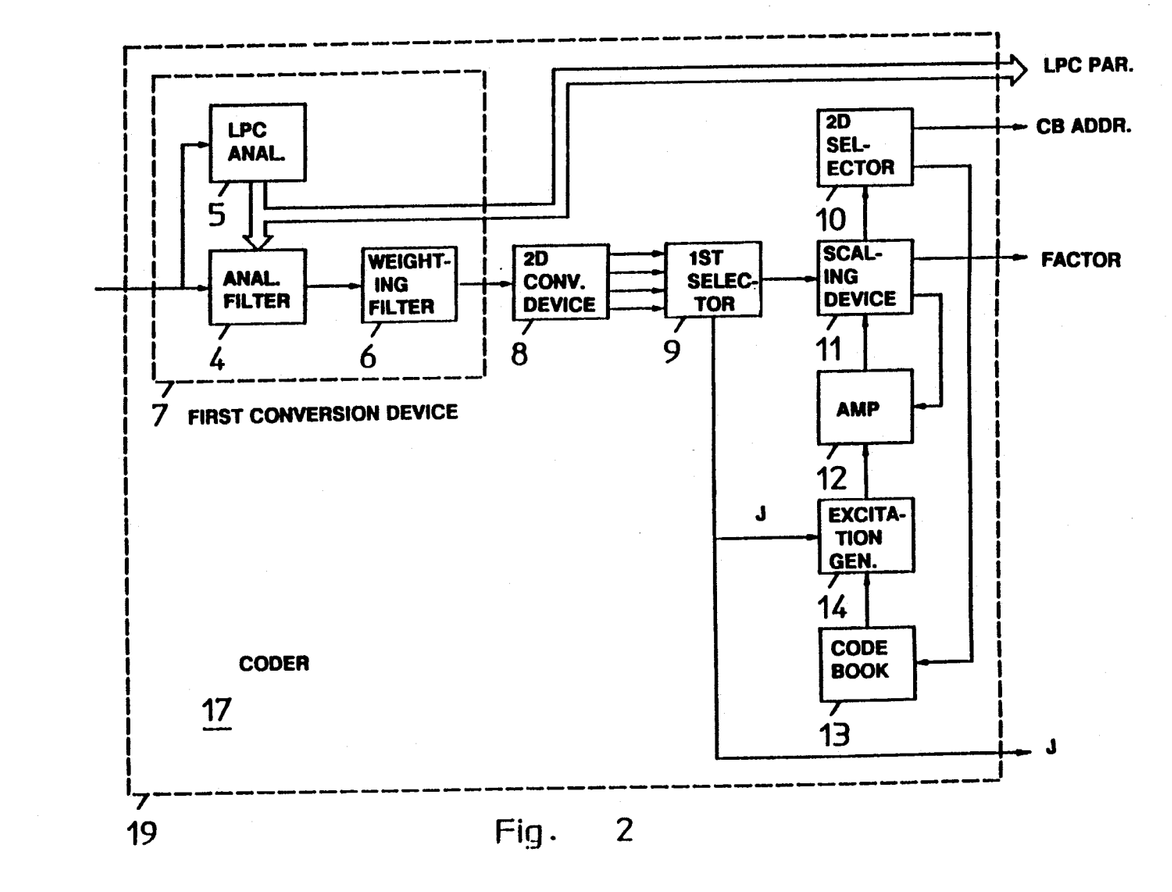
FIGS. 2 shows the amplifier and rectifier circuits for the block diagram of FIG. 1.

FIG. 2 shows an example of a circuit diagram for the IF amplifiers 12-16 and rectifiers 20-24 of FIG. 1. Since IF amplifiers 12-16 are identical to one another and since rectifiers 20-24 are likewise identical to one another, only IF amplifier 12 and rectifier 20 are described below.

IF Amplifier 12 includes NPN transistors 60 and 62 that have their main current paths connected to a current source 64 via a node 66. IF amplifier inputs 68 and 70 are connected to the control electrodes of transistors 60 and 62, respectively. The main current paths of transistors 60 and 62 are also connected to amplifier outputs 72 and 74. A series arrangement with a resistor 76, a resistor 78, a main current path of an NPN transistor 80 and a resistor 82 is located in a first current path between a power supply line Vcc and output 72. Similarly, a series arrangement with a resistor 84, a resistor 86, a main current path of an NPN transistor 88 and a resistor 90 is located in a second current path between power supply line Vcc and output 74. Control electrodes of transistors 80 and 88 are connected to one another and receive a reference voltage Vref1. Outputs 72 and 74 are coupled to inputs of subsequent IF amplifier 14.

Rectifier 20 includes NPN transistors 92 and 94, having their emitters connected to one another and to a node 96. Transistor 92 has its base connected to a node 98 in the first current path between resistor 78 and transistor 80, and has its collector connected to a node 100 in the second current path between resistors 84 and 86. Similarly, transistor 94 has its base connected to a node 102 in the second current path between resistor 86 and transistor 88, and has its collector connected to a node 104 in the first current path between resistors 76 and 78. Rectifier 20 further includes a capacitor 106 arranged between power supply line Vcc and node 96, and a current source 108 connected to node 96. An output 110 of rectifier 20 is also connected to node 96. The other IF amplifiers 14 and 16, and the other rectifiers 22 and 24 are of similar construction. Outputs 112 and 114 of rectifiers 22 and 24 are designated with separate reference numerals for later use.

A differential signal at nodes 68 and 70 generates associated currents through resistors 82 and 90. The resulting differential voltages at nodes 72 and 74 form the output signal that is supplied to subsequent IF amplifier 14. The currents pass through resistors 76 and 78, and through resistors 84 and 86, respectively, and determine the voltages at nodes 98, 100, 102 and 104. In order to better understand circuit operation, assume, for example, that the voltage at input 68 is considerably higher than the voltage at input 70. Effectively, this means that transistor 60 draws current and transistor 62 is blocked, resulting in the output voltage at output 72 being low and the output voltage at output 74 being high. Also, voltages at nodes 98 and 104 are low and voltages at nodes 100 and 102 are high. Accordingly, in rectifier 20 transistor 94 receives a high voltage at its base and a low voltage at its collector, whereas transistor 92 receives a low voltage at its base and a high voltage at its collector.

A signal transition at inputs 68 and 70 carries over into a transition at nodes 98 and 102. As soon as transistor 92 receives a higher voltage at its base than transistor 94, transistor 92 begins to conduct, thereby drawing current from node 100 and, consequently, assisting in pulling low the voltage at output node 102 and accelerating the blocking of transistor 94. The current drawn from node 100 by transistor 92 is supplied to capacitor 106. In this manner, capacitor 106 accumulates charge supplied by transistors 92 and 94, which are turned on alternately depending on the signal at inputs 68 and 70. The voltage at node 96 therefore is indicative of a rectified and peak-detected version of the output voltages at nodes 72 and 74 and is supplied to converter 26 via rectifier output 110.

The cross-coupled arrangement of transistors 92 and 94 forms a positive feed back circuit. This circuit renders the voltage at node 96 highly susceptible to small voltage changes at nodes 98 and 102, which form the rectifier inputs, thereby extending the dynamic range of the logarithmic detector as compared to a rectifier circuit without such positive feed-back. A cross-coupled arrangement of similar structure is known from U.S. Pat. No. 4,593,268 and is used as an absolute value detector in an A/D-converter.

Current source 108 acts as a so-called bleeding device for discharging capacitor 106. Such a bleeding device increases the operational speed of the detector since it reduces the fall time at node 96. Strictly speaking, such a bleeding device is not necessary if rectifier output 110 is discharged by voltage-to-current converter 26, to which it is connected. As will be discussed below, converter 26 includes a bipolar transistor 120 (See FIG. 3) whose base electrode is tied to rectifier output 110. The base current of transistor 120 may be sufficiently high for the bleeding process.

The detector circuit preferably includes a transistor 80 and a transistor 88 for uncoupling IF amplifier 12 from rectifier 20. This disengagement permits extending the range of resistor values used for resistors 76, 78, 82, 84, 86 and 90.

Typically, resistors 76 and 84 are each 8 K, resistors 78 and 86 are each 32 K, resistors 82 and 90 are each 72 K and capacitor 106 is 5 pF, while the current source typically supplies a current of 7.5 $\mu$A. Vref1 at the bases of transistors 80 and 88 has a typical value of 3.5 V, and Vcc is typically 5 V.

Figure 3:
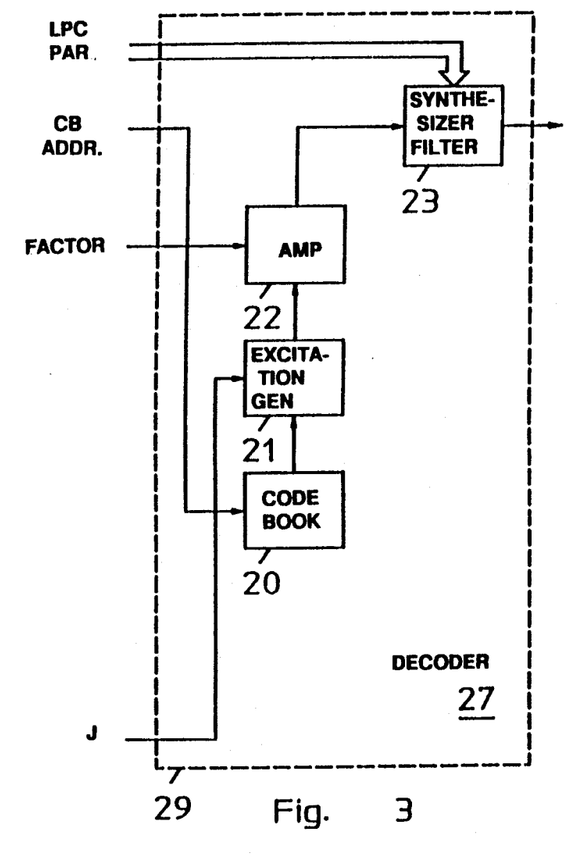
FIG. 3 shows the voltage-to-current conversion and current summing circuits for the block diagram of FIG. 1.

FIG. 3 gives an example of a circuit diagram for converters 26–30 and summing part 32–36 of the detector. Only converter 26 is discussed in more detail below, since converters 26–30 are substantially identical to one another in arrangement and operation.

Converter 26 includes a first emitter-coupled transistor pair with an NPN transistor 120 that has its main current path arranged between a current source 122 and a load 124, and with an NPN transistor 126 similarly located between a current source 128 and a load 130. Loads 124 and 130 here are shown as diode-connected transistors and are connected to Vcc through a Schottky diode 131. A control electrode of transistor 120 is connected to rectifier output 110, which is connected to node 96 (see FIG. 2) for reception of the rectified signal from rectifier 20. A control electrode of transistor 126 receives a control voltage from a dummy stage 200 that is described below.

The emitters of transistors 120 and 126 are interconnected via resistors 132 and 134 that increase the input voltage range over which the emitter-coupled pair behaves as a linear amplifier and determine the gain (emitter degeneration). See, for example, "Analysis and Design of Analog Integrated Circuits", Sec. Edition, P. Gray and R. Meyer, Wiley & Sons, 1984, p. 197. The voltage difference between the bases of transistors 120 and 126 generates approximately the same voltage difference across the series arrangement of resistors 132 and 134. The values of resistors 132 and 134 determine the value of a current through the series arrangement and thus control the scaling of the signal and the gain.

Converter 26 further includes a second emitter-coupled pair with NPN transistors 136 and 138 that have their emitters connected to one another and to a current source 140, and their collectors connected to a current mirror load 142. The base of transistor 136 is connected to a node 144 between the collector of transistor 120 and diode 124, and the base of transistor 138 is connected to a node 146 between the collector of transistor 126 and diode 130. Nodes 144 and 146 form the output of first emitter-coupled pair 120 and 126 discussed above. Note that Schottky diode 131 prevents transistor 136 (or 138) from saturating. The emitter of transistor 136 now is sitting at $V_{cc} - 2V_{be} - V_{Schottky}$. Without Schottky diode 131, the voltage at the collector of transistor 136 would be equal to the voltage at A diode-connected transistor 148 is arranged between an output 150 of second emitter-coupled pair 136 and 138 and the collector of transistor 136, and serves to limit the high voltage level at output 150. The high voltage level at output 150 therefore stays one base-emitter voltage below Vcc.

Output 150 is connected to the emitter of transfer transistor 32. All other converters 28–30 are similarly connected to current mirror 40 through corresponding transfer transistors 34–36. Since the currents supplied to transistors 136 and 138 by current mirror 142 are identical, any difference in current has to be furnished via transfer transistor 32 when diode 148 is blocked. As a result, the currents in all converters 26–30 are summed in current mirror 40. Output 44 of current mirror 40 provides this aggregated current to RSSI resistor 42.

Transfer transistors 32–36 have their control electrodes connected to one another and to voltage supply line V$_{cc}$ via a diode-connected transistor 46. The voltage at node 150 therefore lies substantially two voltage drops of, in this example, $V_{be}$ below $V_{cc}$. Owing to the voltage drops in PNP transistors 152 and 154 of current mirror 142, the voltage at a node 156 is kept at substantially $2V_{be}$ below $V_{cc}$ as well. This balances the individual differential amplifiers in the converters and substantially removes the quiescent (dc) currents from the signals supplied to current mirror 40.

As stated above, transistor 126 and the corresponding transistors in converters 26-28 receive a common control voltage. Preferably, this control voltage is derived from a dummy stage 200 that includes a differential amplifier 202 connected to a rectifier 204, identical to amplifier 12 and rectifier 22, respectively. Amplifier 202 is controlled, not by the input signal, but by a bias voltage $V_{bias}$ that represents a dc component of the input signal, and may be derived from the bypassed base from transistor 62 in FIG. 2.

As can be seen from the drawing, the number of stages, each including an amplifier (12-16), a rectifier (22-24), a voltage-to-current conversion device (26-30) and a transfer transistor (32-36), that can be arranged in a circuit in accordance with the invention is not limited. In the prior art, however, the available power supply restricts the number of stages as a consequence of the number of resistors to be stacked in a ladder.

In the following description of circuit operation, it is assumed that transistor 140 supplies a bias current $I_n$, and that transistors 122 and 128 each supply a current $I_d$. The differential current through the first differential transistor pair 120 and 126, flowing from the former to the latter, is denoted by $i_d$. The differential current though the second differential transistor pair 136 and 138 is denoted by $i_n$. The term $v_{be}(j)$ indicates the base-emitter voltage drop in a transistor or diode with reference numeral j produced by the signal in the circuit.

Then, for the arrangement of transistors 136 and 138, and diodes 124 and 130, the following equation holds true:

$$v_{be}(130)+v_{be}(138)-v_{be}(136)-v_{be}(124)=0 \quad (1)$$

The difference $v_{be}(124) - v_{be}(130)$ between the diode voltage drops, however, is determined by the signal current $i_d$:

$$v_{be}(124)-v_{be}(130)=2V_T\mathrm{tgh}^{-1}(i_d/2I_d) \quad (ii)$$

$V_T$ being the thermal voltage defined as $\{kT/q\}$, wherein k is Boltzmann's constant, T is the absolute temperature and q is the elementary electrical charge. Combining (i) and (ii) leads to:

$$v_{be}(138)-v_{be}(136)=2V_T\mathrm{tgh}^{-1}(i_d/2I_d) \quad (iii)$$

For $v_{be}(138) - v_{be}(136)$, it can also be derived that:

$$v_{be}(138)-v_{be}(136)=2V_T\mathrm{tgh}^{-1}(i_n/I_n) \quad (iv)$$

Now, $i_d$ is the current through resistors 132 and 134 that have equal value R. The voltage difference $v_{signal}$ between the bases of transistors 120 and 126 carries over into substantially the same voltage difference across resistors 132 and 134. Therefore:

$$i_d=v_{signal}/(2R) \quad (v)$$

Upon combining equations (iii), (iv) and (v) the following relation is obtained:

$$i_n=(I_n/2I_d)\{v_{signal}/2R\} \quad (vi)$$

Equation (vi) shows that the signal current in the branches of transistors 136 and 138 is proportional to the ratio of the bias currents and to the signal voltage at input 110 of the converter, and is inversely proportional to the value of the resistors 132 or 134. Typically, resistors 132, 134, 164, 166, 168 and 170 each are 21.25 K, $I_n$ is 50 μA and $I_d$ is 20 μA.

The RSSI function requires a fixed start-up point, i.e., the signal level at which detection begins should be independent of temperature and of process parameter spread. The gain of the IF amplifier should also be insensitive to temperature and process parameter spread for achieving a fixed receiver sensitivity and for preventing regeneration. A temperature dependent RSSI functioning is unacceptable for digital cellular systems, wherein the absolute value of the RSSI output voltage is very critical. The invention circumvents these problems as discussed below.

Emitter-coupled pair 60 and 62 in amplifier 12 of FIG. 2 has a small-signal gain G proportional to a tail current I, supplied by current source 64, proportional to the pair's load $R_a$, which is the value of resistor 82 or 90 in amplifier 12, and inversely proportional to the thermal voltage $V_T=kT/q$, $$G \propto IR_a/V_T \quad (vii)$$

wherein "$\propto$" stands for "is proportional to". See, for example, "Analysis and Design of Analog Integrated Circuits", Sec. Edition, P. Gray and R. Meyer, Wiley & Sons, 1984, p. 203. The thermal voltage $V_T$ introduces a temperature dependence into gain G. In an integrated circuit embodiment, on-chip resistors, such as resistors 82 and 90, also have a temperature coefficient, implicitly given by the sheet resistance ρ of the semiconductor structure and determined by the process, thereby introducing a further temperature dependence in gain G.

Suppose that the gain G of each amplifier, such as of amplifier 12, changes ±2 dB with process parameter spread and temperature; then the overall gain of a cascade of a number of N amplifiers changes ±2N dB. This, for example, could cause severe regeneration and oscillation problems at low temperature, due to an excess gain and bandwidth, whereas at high temperature, reduced gain will reduce the sensitivity of the detector.

A well-controlled gain G is achieved by making the tail current I directly proportional to the absolute temperature T and inversely proportional to the sheet resistance. This will render the gain insensitive to temperature and process variations. However, a tail current with this proposed temperature dependence conflicts with the desired temperature independence of the rectified voltage produced by rectifier 20. The excess voltage produced at node 96 when tail current I has the above-proposed form is given by:

$$v_{rect} \propto IR_{rect} \propto (T/\rho)\rho = T \quad (viii)$$

wherein $R_{rect}$ is a resistance value that takes into account resistors 76, 78, 84, and 86, and ρ is the sheet resistance for any of resistors 76, 78, 82, 84, 86 and 90. Accordingly, rectifier 20 produces a signal directly proportional to the absolute temperature T.

The rectifier output voltage of rectifier 20 is supplied to input 110 of voltage-to-current converter 26. As discussed above, a signal current $i_n$ as a result of the voltage $V_{signal}$ at input 110 is given by:

$$i_n = (I_n/2I_d)\{v_{signal}/R\} \qquad \text{(vi)}$$

Note that $V_{signal}$ at node 110 is proportional to the absolute temperature according to (viii), and that without appropriate measures $i_n$ and therefore the voltage $v_{RSSI}$ across RSSI resistor 42 will be temperature dependent as well:

$$v_{RSSI} \propto v_{signal}(1/R) R_{RSSI} \qquad \text{(ix)}$$

wherein $R_{RSSI}$ is the value of resistor 42. If resistors 132, 134 and 42 are of the same type, expression (iv) becomes:

$$v_{RSSI} \propto v_{signal} \propto t \qquad \text{(x)}$$

Expression (x) reflects the temperature dependence of the output voltage of the logarithmic detector when the starting point has been fixed by fixing the gain of the amplifiers.

The invention solves the problem of an undesired temperature dependence by means of adapting the behavior of currents $I_n$ and $I_d$. If current $I_d$ is made proportional to the absolute temperature then the proportionality of $v_{RSSI}$ to the temperature is cancelled. If $I_n$ and $I_d$ further include the same factors to take into account process parameters and their implicit dependence on temperature, a substantially temperature independent performance of the log detector is obtained. Such process parameter is, for example, the sheet resistance of a resistor in an integrated circuit embodiment.

It has already been mentioned above that a current source supplying a current proportional to the absolute temperature and inversely proportional to a resistance, and that a current source supplying a current inversely proportional to a resistance are well known in the art. The former type would then be suitable to provide $I_d$ and the latter to provide $I_n$. Transistors 122 and 128, 164 and 166, and 168 and 170 are then, for instance, connected to the former type current source via a current mirror. Similarly, transistors 140, 160 and 162 are, for instance, connected to the latter type of current source via a further current mirror.

While the invention has been particularly shown and described with reference to a preferred embodiment thereof, it will be understood by those skilled in the art that various changes in form and detail may be made without departing from the spirit and scope of the invention.

We claim:

1. An electronic circuit with a logarithmic detector, comprising:
   amplifying means responsive to an input voltage for amplifying the input voltage to produce a series of successively-amplified versions of the input voltage;
   rectifying means coupled to the amplifying means for rectifying the successively-amplified versions to produce rectified versions;
   conversion means coupled to the rectifying means for converting the rectified versions into currents; and
   current summing means coupled to the conversion means for summing the currents to produce an aggregate output current, wherein:
   the amplifying means comprises a cascade of a plurality of voltage amplifiers (12, 14, 16), each amplifier generating a respective one of the amplified versions of the input voltage, and each amplifier comprising:
   a first differential transistor pair (60, 62) having first and second transistors connected to a first current source (64) and operative to complementarily control first and second current branches, respectively, the first and second branches comprising first and second resistors, respectively;
   the conversion means comprises a plurality of converters (26, 28, 30), each respective one thereof being coupled to a respective one of the voltage amplifiers via the rectifying means and comprising:
   a second differential transistor pair (120, 126) biased by a second current source and having a third current branch with a first load that includes a first load transistor (124), and having a fourth current branch with a second load that includes a second load transistor (130), wherein main current paths of the second pair are interconnected via a resistor (132, 134);
   a third differential transistor pair (136, 138) biased by a third current source (140) and having first and second control electrodes coupled to the third and fourth current branches, respectively, between the first and second loads, respectively, and the second pair; and wherein:
   the first current source supplies a first current whose value is substantially proportional to the absolute temperature; and
   the second current source and the third current source supply second and third currents, respectively, a ratio of values of the third and second currents being substantially proportional to the absolute temperature.

2. The circuit of claim 1, wherein:
   the rectifying means comprises a plurality of rectifiers, a respective one of the rectifiers being coupled to the first differential transistor pair of a respective one of the amplifiers, each rectifier comprising:
   a capacitor;
   a first transistor with a main current path arranged between the first current branch and the capacitor, and with a control electrode coupled to the second current branch; and
   a second transistor with a main current path arranged between the second current branch and the capacitor, and with a control electrode coupled to the first current branch.

3. The circuit of claim 1, wherein the second current is proportional to the absolute temperature and inversely proportional to a selected process parameter, and the third current is inversely proportional to the selected process parameter.

4. The circuit of claim 3, wherein the process parameter is associated with a sheet resistance.

5. An apparatus having a received signal strength indicator comprising an electronic circuit with logarithmic detector that includes:
   amplifying means responsive to an input voltage for amplifying the input voltage to produce a series of successively-amplified versions of the input voltage;

rectifying means coupled to the amplifying means for rectifying the successively-amplified versions to produce rectified versions;

conversion means coupled to the rectifying means for converting the rectified versions into currents; and current summing means coupled to the conversion means for summing the currents to produce an aggregate output current, wherein:

the amplifying means comprises a cascade of a plurality of voltage amplifiers (12, 14, 16), each amplifier generating a respective one of the amplified versions of the input voltage, and each amplifier comprising:

a first differential transistor pair (60, 62) having first and second transistors connected to a first current source (64) and operative to complementarily control first and second current branches, respectively, the first and second branches comprising first and second resistors, respectively;

the conversion means comprises a plurality of converters (26, 28, 30), each respective one thereof being coupled to a respective one of the voltage amplifiers via the rectifying means and comprising:

a second differential transistor pair (120, 126) biased by a second current source and having a third current branch with a first load that includes a first load transistor (124), and having a fourth current branch with a second load that includes a second load transistor (130), wherein main current paths of the second pair are interconnected via a resistor (132, 134);

a third differential transistor pair (136, 138) biased by a third current source (140) and having first and second control electrodes coupled to the third and fourth current branches, respectively, between the first and second loads, respectively, and the second pair; and wherein:

the first current source supplies a first current whose value is substantially proportional to the absolute temperature; and the second current source and the third current source supply second and third currents, respectively, a ratio of values of the third and second currents being substantially proportional to the absolute temperature.

6. The apparatus of claim 5 wherein:

the rectifying means comprises a plurality of rectifiers, a respective one of the rectifiers being coupled to the first differential transistor pair of a respective one of the amplifiers, each rectifier comprising:

a capacitor;

a first transistor with a main current path arranged between the first current branch and the capacitor, and with a control electrode coupled to the second current branch; and a second transistor with a main current path arranged between the second current branch and the capacitor, and with a control electrode coupled to the first current branch.

* * * * *

UNITED STATES PATENT AND TRADEMARK OFFICE
CERTIFICATE OF CORRECTION

PATENT NO. : 5,296,761
DATED : March 22, 1994
INVENTOR(S) : Ali Fotowat-Ahmady et al It is certified that error appears in the above-indentified patent and that said Letters Patent is hereby corrected as shown below:

The title page showing the illustrative figure should be deleted to be replaced with the attached title page.

Sheets 1-3 of the drawings, consisting of Figs. 1-3, should be deleted to be repalced with sheets 1-3, consisting of Figs. 1-3, as shown on the attached pages.

Signed and Sealed this

Eleventh Day of October, 1994

Attest:

BRUCE LEHMAN

Attesting Officer    Commissioner of Patents and Trademarks

United States Patent [19]

Fotowat-Ahmady et al.

[11] Patent Number: 5,296,761
[45] Date of Patent: Mar. 22, 1994

[54] TEMPERATURE-COMPENSATED LOGARITHMIC DETECTOR HAVING A WIDE DYNAMIC RANGE

[75] Inventors: Ali Fotowat-Ahmady, Tehran, Iran; Nasrollah S. Navid, Saratoga, Calif.

[73] Assignee: North American Philips Corporation, New York, N.Y.

[21] Appl. No.: 974,631

[22] Filed: Nov. 23, 1992

[51] Int. Cl.⁵ .............................................. H03F 1/30
[52] U.S. Cl. .................................... 307/492; 307/310; 307/491; 307/494; 307/418
[58] Field of Search ............... 307/492, 491, 310, 494, 307/498; 328/26, 32

[56] References Cited

U.S. PATENT DOCUMENTS

| | | | |
|---|---|---|---|
| 3,417,263 | 12/1968 | Thomas | 307/492 |
| 3,745,474 | 7/1973 | Hughes | 307/492 |
| 3,848,139 | 11/1974 | Holt, Jr. | 307/235 |
| 4,053,796 | 10/1977 | van de Plassche | 307/261 |
| 4,593,268 | 6/1986 | Blauschild | 340/347 AD |
| 4,972,512 | 11/1990 | Garskamp | 307/492 |
| 5,049,829 | 9/1991 | Garskamp et al. | 307/492 |
| 5,070,303 | 12/1991 | Dent | 307/492 |
| 5,130,567 | 7/1992 | Rutten et al. | 307/491 |

OTHER PUBLICATIONS

"Analysis and Design of Analog Integrated Circuits", Sec. Edition. P. Gray and R. Meyer, Wiley & Sons, 1984, pp. 197, 203, 275–284, 284–296.

Primary Examiner—William L. Sikes
Assistant Examiner—My-Trang Nu Ton
Attorney, Agent, or Firm—Steven R. Biren

[57] ABSTRACT

An IF amplifier/log detector with a modular architecture includes a plurality of voltage amplifiers, a plurality of rectifiers, a plurality of voltage-to-current converters and a current summing circuit. Each amplifier has a first differential transistor pair driven by a first current proportional to the temperature to fix the gain. Each converter includes a second differential transistor pair driven by a current proportional to the temperature and inversely proportional to a process parameter, and a third differential transistor pair driven by a third current inversely proportional to the process parameter. In this manner a circuit having improved performance with variations in temperature and process parameters is obtained.

6 Claims, 3 Drawing Sheets